(12) United States Patent
Letas

(10) Patent No.: US 9,397,599 B2
(45) Date of Patent: Jul. 19, 2016

(54) WIND FARM HARMONIC PREDICTOR AND METHOD FOR PREDICTING HARMONICS

(71) Applicant: REpower Systems SE, Hamburg (DE)

(72) Inventor: Heinz-Hermann Letas, Bovenau (DE)

(73) Assignee: Senvion SE, Hamburg (DE)

( * ) Notice: Subject to any disclaimer, the term of this patent is extended or adjusted under 35 U.S.C. 154(b) by 583 days.

(21) Appl. No.: 13/749,251

(22) Filed: Jan. 24, 2013

(65) Prior Publication Data
US 2013/0207393 A1 Aug. 15, 2013

Related U.S. Application Data

(60) Provisional application No. 61/590,100, filed on Jan. 24, 2012.

(51) Int. Cl.
*H02P 9/04* (2006.01)
*F03D 9/00* (2016.01)
*H02J 3/01* (2006.01)
(Continued)

(52) U.S. Cl.
CPC *H02P 9/04* (2013.01); *F03D 9/005* (2013.01); *H02J 3/01* (2013.01); *H02J 3/1842* (2013.01); *H02J 3/386* (2013.01); *G01R 19/2513* (2013.01); *G01R 31/42* (2013.01); *Y02E 10/72* (2013.01); *Y02E 10/763* (2013.01); *Y02E 40/22* (2013.01); *Y02E 40/40* (2013.01)

(58) Field of Classification Search
CPC .......... F03D 9/005; H02P 9/04; H02J 3/1842; H02J 3/01; H02J 3/386; Y02E 40/22; Y02E 10/763; Y02E 40/40; G01R 19/2513; G01R 31/42

USPC ........ 702/181; 290/44; 307/82, 151; 700/298
See application file for complete search history.

(56) References Cited

U.S. PATENT DOCUMENTS 7,999,418 B2 *   8/2011   Wang et al. ................... 307/151
8,217,533 B2 *   7/2012   Jones et al. ..................... 307/82
(Continued)

FOREIGN PATENT DOCUMENTS

EP   1 959 136   8/2008
EP   2 209 200   7/2010

OTHER PUBLICATIONS

International Search Report and Written Opinion mailed Sep. 17, 2013, directed to International Application No. PCT/EP2013/051311; 21 pages.
(Continued)

*Primary Examiner* — Carol S Tsai
(74) *Attorney, Agent, or Firm* — Morrison & Foerster LLP

(57) ABSTRACT

A harmonic predictor for a wind farm comprising at least two wind turbines, each having a generator with a converter for generating electrical energy. The harmonic predictor determines the harmonic component expected from the wind farm in order to limit the harmonic component to a harmonic limit. The harmonic predictor comprises a calculation module, an iteration module and a summing module. The calculation module calculates a complex mean value over at least one period of the harmonic component of one of the wind turbines and determines a first equivalent vector therefrom. The iteration module successively connects the calculation module to at least one other of the wind turbines to form at least one second equivalent vector. The summing module sums the equivalent vectors to form a total vector and compares the total vector with the harmonic limit.

11 Claims, 3 Drawing Sheets

(51) Int. Cl.
  *H02J 3/38* (2006.01)
  *H02J 3/18* (2006.01)
  *G01R 31/42* (2006.01)
  *G01R 19/25* (2006.01)

(56) References Cited

U.S. PATENT DOCUMENTS

| | | | |
|---|---|---|---|
| 8,502,403 B2* | 8/2013 | Merswolke et al. | 290/44 |
| 8,821,108 B2* | 9/2014 | Nayebi et al. | 415/40 |
| 8,896,142 B2* | 11/2014 | Arlaban Gabeiras et al. | 290/44 |
| 2008/0284252 A1* | 11/2008 | Jones et al. | 307/82 |
| 2009/0150126 A1 | 6/2009 | Sellamanickam et al. | |
| 2011/0133453 A1* | 6/2011 | Merswolke et al. | 290/44 |
| 2011/0156389 A1* | 6/2011 | Arlaban Gabeiras et al. | 290/44 |
| 2011/0260547 A1* | 10/2011 | Wang et al. | 307/82 |
| 2012/0133211 A1* | 5/2012 | Jones et al. | 307/82 |
| 2013/0018773 A1* | 1/2013 | Edvardson | 705/37 |

OTHER PUBLICATIONS

International Preliminary Report on Patentability mailed Jul. 29, 2014, directed to International Application No. PCT/EP2013/051311; 10 pages.

* cited by examiner

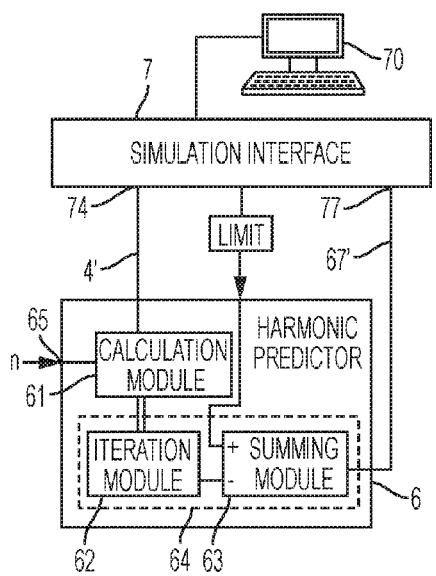
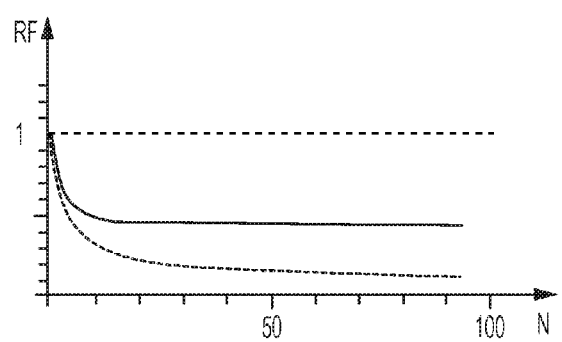
FIG. 2
FIG. 3
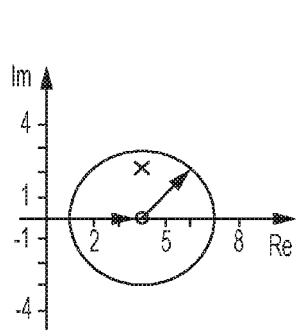
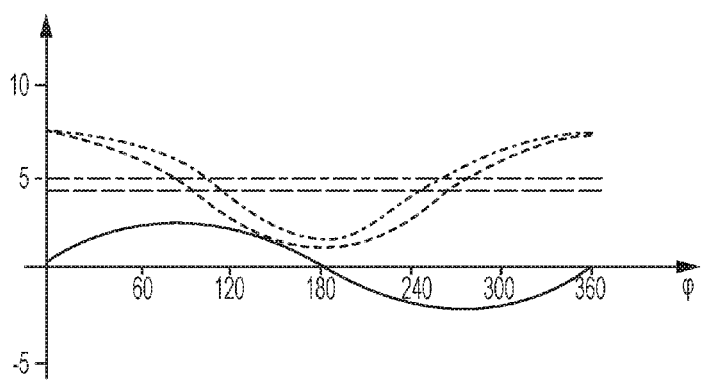
FIG. 4
FIG. 5

WIND FARM HARMONIC PREDICTOR AND METHOD FOR PREDICTING HARMONICS

REFERENCE TO RELATED APPLICATIONS

This application claims the priority of U.S. Provisional Application No. 61/590,100, filed Jan. 24, 2012, the entire contents of which are incorporated herein by reference.

FIELD OF THE INVENTION

The invention relates to a wind farm with at least two wind turbines, each having a generator with a converter for generating electrical energy.

BACKGROUND OF THE INVENTION

On account of the increasing number and size of wind farms, when wind farms are operated on the electrical transmission network it is of increasing importance that they act on the network in a stabilizing manner. By this means, wind farms make their contribution to safeguarding the stability of the electrical network. An important parameter of network quality is the harmonic content. Relevant regulations limit amplitude depending on the order of the harmonics in order to obtain adequate network quality. As a result of the switching processes in the converter, modern converter-controlled wind turbines generate harmonics of different kinds, both those with even and odd order and those with a fixed phase relationship to the network or those with a variable phase relationship to the network. Wind turbines are measured as part of a type test which is to be carried out for each type of wind turbine, and characteristic values are determined therefrom. If a plurality of wind turbines is to be connected to the network, as in the case of a wind farm, as a rule the harmonics are determined from the values for the individual wind turbines with the help of a calculation method. The harmonics emitted by the wind farm as a whole must remain below certain limits. In practice, this often imposes a limit on the wind farm.

When calculating the harmonics for wind farms based on the certified measurements for the individual wind turbine, different procedures are used depending on the type of harmonic: harmonics with low odd order numbers are viewed as typical for machine or mains-commutated converters using thyristor technology. The harmonics are fixed in phase relative to the fundamental, and the harmonics of the individual wind turbines add in a scalar manner. For a farm with N wind turbines, this results in N times the value of a single wind turbine. Higher-order harmonics, in particular in the region of the converter switching frequency, are viewed as typical for freewheeling pulse inverters. The phase relationship of wind turbines equipped with said inverters is not fixed relative to the fundamental, but can drift relative thereto. In fact, the phase relationship is statistically evenly distributed. The values of the individual wind turbines therefore do not add directly; instead, in accordance with the statistical distribution, a proliferation corresponding to the square root of the wind turbines can be applied for these harmonics (100 wind turbines therefore do not generate 100 times the value of a single wind turbine but only 10 times). As this results in a reduction in relation to the approach with low order numbers with scalar multiplication, this is also referred to as a reduction factor of $1/\sqrt{N}$.

Harmonics with low but even order numbers are only inadequately considered in the regulations. As a rule, they contain a significant fixed-phase portion and are therefore a mixture of fixed-phase and variable-phase. The reduction factor $1/\sqrt{N}$ applicable to variable-phase harmonics cannot therefore be used. Conventionally, therefore, a direct scalar addition is carried out without reduction. This is unsatisfactory, as the limits are often very low, as a result of which the size of the wind farm is significantly restricted with regard to the number of wind turbines.

In addition, the diversity of calculation methods makes the application cumbersome depending on the type of harmonic.

SUMMARY OF THE INVENTION

The invention is based on the object of avoiding this disadvantage and achieving a universal reduction which can be applied for all even and odd harmonics and also those at intermediate frequencies, and in particular even for low even harmonics.

The solution according to the invention lies in the characteristics of the independent claims. Advantageous improvements are the subject matter of the dependent claims.

According to the invention, a wind farm with at least two wind turbines, each having a generator with a converter for generating electrical energy, is provided with a harmonic predictor which determines the harmonic component expected from the wind farm in order to limit it to a harmonic limit, and which for this purpose is designed with a calculation module which calculates a complex mean value over at least one period of the harmonic component of one of the wind turbines and determines a first equivalent vector therefrom, an iteration module which successively connects the calculation module to at least one other of the wind turbines to form at least one second equivalent vector, and a summing module which sums the equivalent vectors to form a total vector and compares it with the harmonic limit.

First of all, let us explain some of the terms used:

A complex mean value is understood to be a mean value which is calculated in the complex number plane taking into account the real part and the imaginary part of the harmonic. It is therefore a complex number.

"Successively connects" is understood to mean that the iteration module interacts with the calculation module in such a way that the complex mean value is formed for a second wind turbine and, if necessary, for a third, fourth and further wind turbines, so that accordingly second, third, fourth and, if necessary, further equivalent vectors are formed.

The invention is based on the knowledge that the harmonic component emitted by the wind turbines of a wind farm as a whole can be more accurately estimated by taking into account the respective mean phase relationships. The invention achieves this in an elegant manner by combining a calculation for each wind turbine in its own right, this being carried out successively in an iteration process for all wind turbines of the wind farm to be considered, with subsequent summing over the individual wind turbines. In this way, the calculation for the wind farm as a whole, which can only be carried out with difficulty, is reduced to a calculation for the individual wind turbines, wherein an analysis with the correct phase relationship can be achieved as a result of the design of the calculation module with the implementation of a complex mean value generator. Wind turbines with variable-phase parts of the harmonics which are offset with respect to one another therefore partially cancel one another out or only add to one another to a small extent. With this vectorial summation, a total vector, which is significantly smaller than that which is calculated in the conventional manner, is finally determined for the whole wind farm.

The invention has recognized that a predictor formed on this basis also estimates the harmonics with sufficient accuracy in cases where the harmonics comprise fixed-phase and variable-phase components. Conventionally, only cases with purely variable-phase harmonics could be determined by vectorial addition. The invention now enables this to be carried out for mixed cases, and therefore achieves a widely usable predictor. It is suitable for all harmonics, whether even, odd or at intermediate frequencies. In particular, this predictor is also suitable for use with even harmonics of a low order, which were previously only inadequately considered.

A substantially more accurate estimate of the harmonic component emitted by the wind farm as a whole can therefore be achieved by means of the predictor according to the invention, namely precisely and particularly in cases where the harmonic component is a mixed case of fixed-phase and variable-phase parts. This results in a significant advance in comparison with the estimate based on a purely scalar addition which was previously common in the prior art. With the predictor according to the invention, it is therefore possible to arrange more wind turbines at a given connecting point.

Expediently, the iteration module and the summing module are combined to form a recursion module. By this means, the harmonic component can be determined easily and in an easily understandable manner for an increasing number of wind turbines in the wind farm. This makes it possible to then cease recursion when the harmonic limit is reached. In this way, the harmonic predictor immediately directly outputs the maximum number of wind turbines for a wind farm that can be connected. This is a considerable simplification for practical application.

Preferably, the calculation module has an offset unit for a fixed-phase part of the harmonic component of the wind turbine, a rotator for a variable-phase part of the harmonic component, and a vectorizer which is designed to determine the equivalent vector based on mean values of offset unit and rotator by magnitude and angle. The fixed-phase part in particular can be easily determined by means of the offset unit. Characteristic of this is that it typically always has the same phase for the wind turbines of the wind farm under consideration. It can therefore be calculated in a simplified manner by means of the offset unit. The rotator, which represents the variable rotating part of the harmonic component, is preferably provided for the variable-phase part. With the various wind turbines under consideration, the variable-phase part is by definition not rigidly coupled but independent. A vectorial calculation therefore results in different directions for the vectors (even if they all have the same magnitude or length), so that the desired reduction is formed therein on account of the different angles. The vectorizer measures these differences with regard to the angles and takes them into account in the summation in order to ultimately determine the equivalent vector, which is determined by a certain magnitude (length of the vector) and angle (phase relationship).

In a particularly advantageous embodiment, which possibly merits independent protection, the converter of the wind turbine is adjustable with regard to its fixed-phase and variable-phase part of the harmonic component. With modern high-frequency pulse converters, it has been shown that, although harmonics cannot be (completely) avoided, they can be influenced with regard to their mean phase relationship. The magnitude and, above all, the angular position of the equivalent vector can be affected by shifting the weighting between fixed-phase and variable-phase part. This enables values to be set for the individual wind turbines so that they mutually neutralize one another as far as possible in their effect on the harmonics. This makes it possible to provide more wind turbines in the wind farm without exceeding the harmonic limit. For this purpose, the harmonic predictor expediently works together with a limiter. This adjusts the ratio between fixed-phase and variable-phase part in such a way that a reduction to the desired limit is achieved. Alternatively or additionally, the limiter can also be designed so that the number of wind turbines which emit electrical energy is limited in order to guarantee that the harmonic limit is maintained in critical cases.

Preferably, the harmonic predictor is designed particularly for even order harmonics, namely in particular up to those of the 50th order. Particularly preferred is a design for low harmonics (up to the 20th order) and/or high harmonics in the region of the converter switching frequency.

The invention further extends to a method for limiting the harmonic component generated by a wind farm, wherein the wind farm comprises at least two wind turbines, each having a generator with a converter for generating electrical energy, wherein, according to the invention, for a first of the wind turbines, a calculation is provided of a complex mean value over at least one period of the harmonic component and determination therefrom of a first equivalent vector with magnitude and angle, and for at least one second of the wind turbines, iterative determination of a second equivalent vector in the same manner, and finally use of the first equivalent vector as the foot of the second equivalent vector for summation and subsequent formation of a total vector and its comparison with the harmonic limit. The foot of a vector is understood to mean the end opposite the tip.

For more detailed explanation of the method, reference is made to the explanation above relating to the wind farm.

The invention further extends to a corresponding harmonic predictor for a wind farm and the corresponding method. Reference is made to the above explanations. In addition, it is noted that the harmonic predictor can expediently be provided with a simulation interface. This serves to function as an interface with a simulation environment, in which the wind farm with its wind turbines is implemented. This enables the harmonic predictor according to the invention to be also applied to wind farms in their development and planning phase, that is to say without them having to be already realized in practice. This results in a significant expansion of the application spectrum of the harmonic predictor according to the invention.

BRIEF DESCRIPTION OF THE DRAWINGS

The invention is explained below with reference to the attached drawings in which an advantageous exemplary embodiment is shown. In the drawings:

FIG. 2: shows an alternative embodiment with the harmonic predictor according to the invention;

FIG. 3: shows a diagram of the reduction in the harmonic component achieved with the harmonic predictor;

FIG. 4: shows a representation of the fixed-phase and variable-phase portion of the harmonic component of a wind turbine;

FIG. 5: shows magnitudes and mean values of the harmonic component over one period;

DETAILED DESCRIPTION OF THE INVENTION

Figure 1:
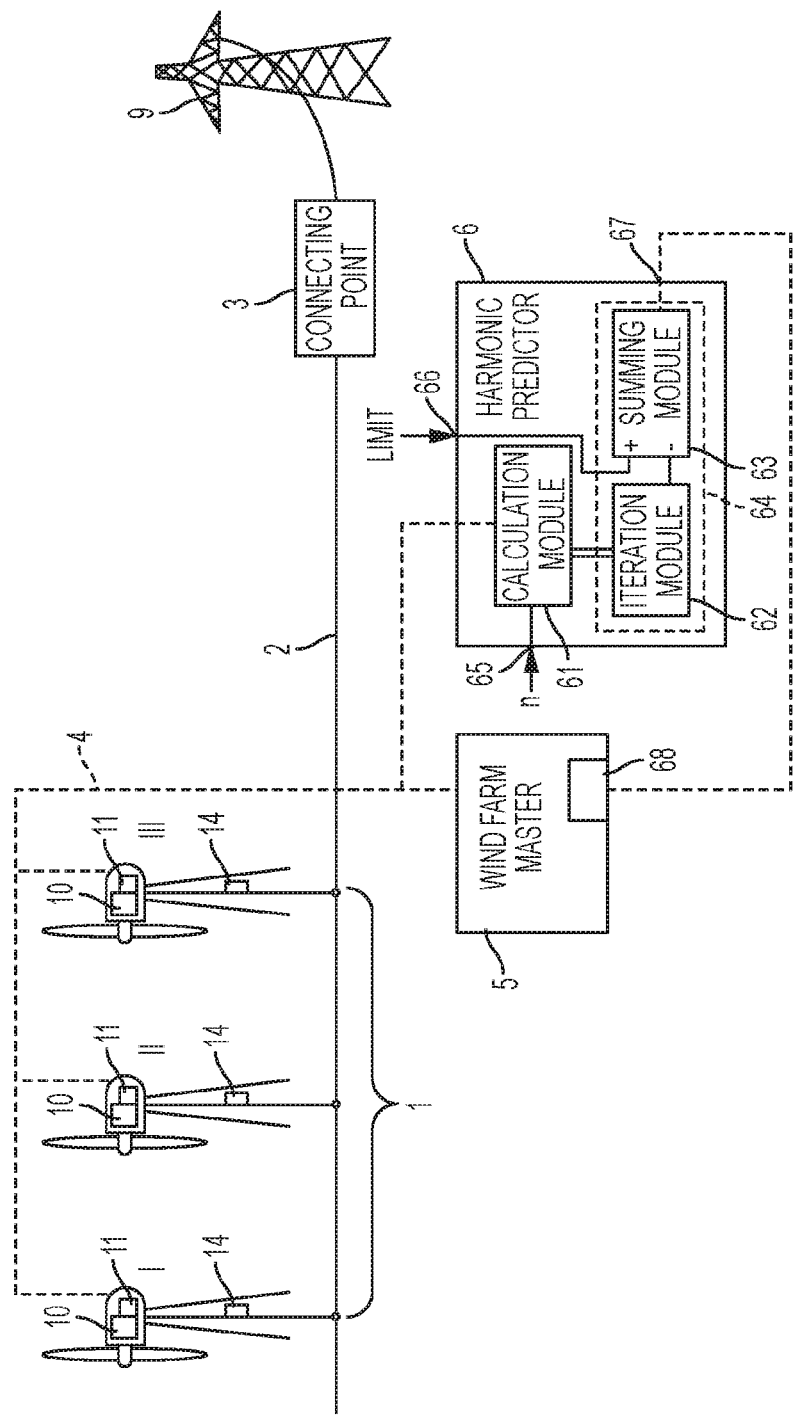
FIG. 1: shows an overview of a wind farm with a harmonic predictor according to the invention.

An exemplary embodiment of a wind farm with a harmonic predictor according to the invention is shown in FIG. 1. The wind farm comprises a plurality of wind turbines 1, three wind turbines being provided in the exemplary embodiment shown. They are constructed in an identical manner and designated by means of Roman numerals I, II and III respectively for identification. The wind turbines 1 in each case have a doubly-fed asynchronous generator 10 with a converter 11, and are connected to a common network 2, which is in the form of a medium-voltage network, in order to output the electrical energy generated. This leads to a connecting point 3, which usually contains a high-voltage transformer (not shown) for connecting to a high-voltage network 9.

A wind farm master 5, which carries out a superimposed control for the wind turbines of the wind farm, is also provided. The wind farm master 5 is connected to the wind turbines 1 by means of a separate signal cable network 4.

Also connected to the signal cable network 4 is a harmonic predictor 6. This comprises a calculation module 61, an iteration module 62 and a summing module 63. The iteration module 62 and the summing module 63 are combined to form a recursion module 64. An input 65 for the order of the harmonic n to be processed by the harmonic predictor is arranged on the calculation module 61. Low even-numbered orders are normally furnished here. Further, an input 66 for a harmonic limit is provided on the harmonic predictor 6. An output connection 67 of the harmonic predictor 6 is fed back to a limiter 68 which is arranged on the farm master 5.

Signals relating to the harmonic to be processed, in particular with reference to the fixed-phase and variable-phase portion, are provided by the wind turbine 1 via the signal cable network 4. As a rule, this information is available in an operating control system of the wind turbine 1 and can be requested therefrom, as appropriate sensors are available in the wind turbine 1 itself. However, it can also be provided that the appropriate values are measured separately by means of sensors 14 on the individual wind turbines and transmitted via the signal cable network 4.

From the values so applied, the calculation module 61 determines a complex mean value of the harmonic component over at least one full period and calculates an equivalent vector therefrom. This is described in more detail below with reference to FIGS. 4 and 5.

A harmonic component of one of the wind turbines, wind turbine I being used as an example, is shown in the complex plane in FIG. 4. The harmonic component has a fixed-phase part and a variable-phase part. The coordinate system for the complex representation of the harmonic component is chosen so that the fixed-phase part lies on the real axis. In FIG. 4, the fixed-phase part is shown with a dashed horizontal arrow. In addition to the fixed-phase part comes the variable-phase part, which is shown as a circular rotating vector with a thin continuous arrow. This arrow rotates at the frequency resulting from the order of the harmonic. The total value of the harmonic component at any given time is represented by the tip of the thin arrow, the foot of which lies on the tip of the dashed arrow for the fixed-phase part. This results in the characteristic values shown in FIG. 5. In FIG. 5, the real part of the harmonic component is shown by the dashed line, and the imaginary part of the harmonic component is shown by the continuous line. The magnitude of the complex number which is defined by the respective real part and imaginary part is shown by the chain-dotted line. It can be seen that this line, unlike the lines for the real and imaginary part, does not have a sinusoidal pattern, but rather has a flat spot in the region around the angle 180°. This results from the fact that, when considering the tip of the arrow of the continuous line in FIG. 4, this is at an almost constant distance from the origin as it sweeps through at the left-hand end of the circle, that is to say in the region facing the imaginary axis. This means that the magnitude of the vector for the whole harmonic component, which runs from the origin to the tip of the continuous arrow, is minimal in this region. The flat spot therefore ultimately results from the superimposition of the linear displacement due to the fixed-phase portion, which acts like an offset, and the rotation due to the variable-phase part.

Also shown as horizontal lines in FIG. 5 are the mean values for the real part (dashed) and the mean value for the total value of the harmonic component (fixed-phase and variable-phase part) shown chain-dotted. The mean value for the complex vector of the harmonic component is likewise complex and is shown by a cross in FIG. 4. According to the invention, this is used as an equivalent value for the harmonic component, the magnitude of which corresponds to the mean amplitude of the harmonic component. The calculation module 61 supplies this complex mean value at its output as an equivalent vector.

Figure 6:
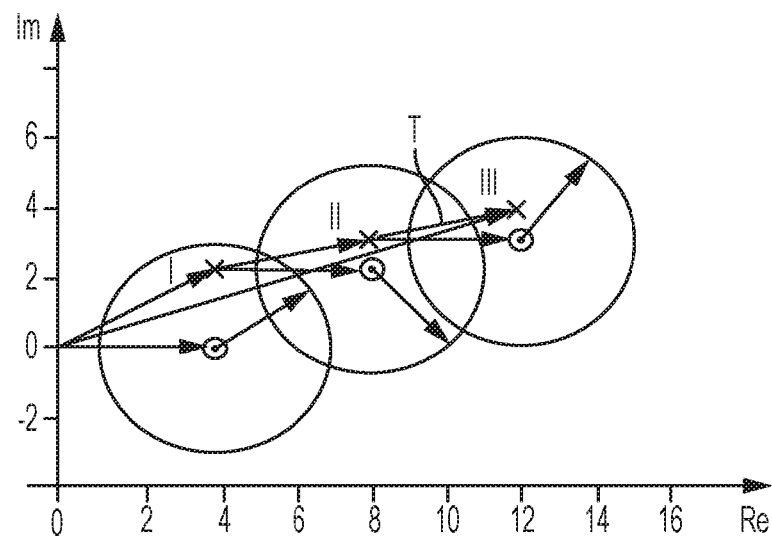
FIG. 6: shows a graphical illustration of the prediction method for three wind turbines.

The iteration module 62 ensures that the calculation shown above for the example of wind turbine I is repeated accordingly for the further wind turbines, in the example II and III. The summing module 63 sums these values. This is visualized in FIG. 6. It contains three circular representations which are designated by the Roman numerals I, II and III for the three wind turbines. The representation of the first circle corresponds to that in FIG. 4 for wind turbine I. Its equivalent vector, which acts as an equivalent value, is shown by the chain-dotted arrow next to the Roman numeral I. The calculation is carried out for the second wind turbine II starting from this equivalent value, that is to say, from a graphical point of view, starting from the tip of the equivalent vector. This means that it acts as a zero point for the fixed-phase portion, which leads to a horizontal displacement along the real axis. This is shown by the dashed arrow next to the numeral II. In turn, the rotating vector for the variable-phase part is shown around the tip of this arrow by means of a continuous line. As the second wind turbine II has a different mean phase relationship with respect to its variable-phase harmonic component, the equivalent vector (chain-dotted arrow next to the numeral II), which is calculated for said harmonic component in the same manner as for wind turbine I, has a different orientation from the equivalent vector for wind turbine I. A vectorial addition of the two equivalent vectors therefore takes place. This procedure is repeated for the third wind turbine III by means of the iteration module 62 and the summing module 63, resulting in the third equivalent vector, which is shown by the chain-dotted arrow next to the numeral III in FIG. 6. From these three equivalent vectors, the summing module 63 finally forms a total vector T, which is shown by a thick continuous line. This represents the mean value of the total harmonic contribution generated by the wind turbines I-III taking into account the respective fixed-phase and variable-phase portions and their relative phase relationship.

Figure 7:
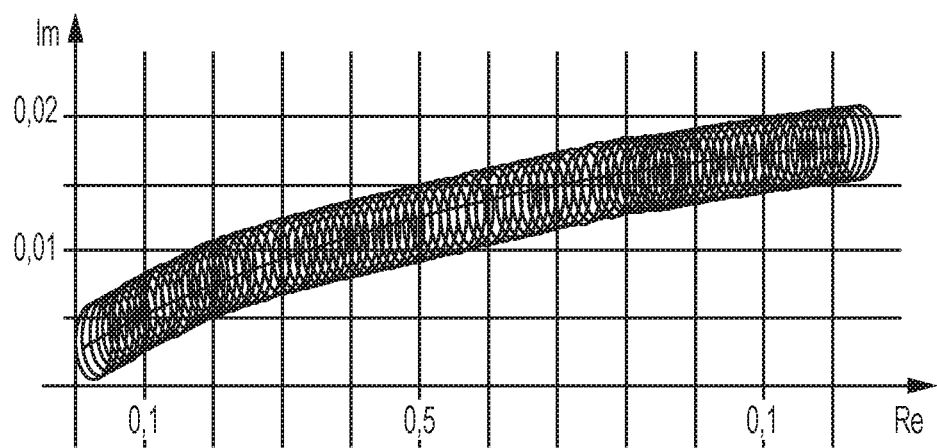
FIG. 7: shows an expanded representation for a large number of wind turbines in the wind farm.

If this method is carried out for a larger number of wind turbines, for example for about 100 wind turbines, this results in the pattern shown in FIG. 7. A characteristic, which qualitatively corresponds to a square root characteristic, can be seen from the overall pattern. This means that, according to the harmonic predictor according to the invention, the total harmonics of a wind farm comprising a correspondingly large number N of wind turbines do not correspondingly increase N times, but roughly follow a $1/\sqrt{(N)}$ characteristic. By this means, the over-all behavior of a wind farm can be correspondingly estimated with the predictor according to the invention, even for wind turbines whose harmonic components are mixed in the sense that they contain fixed-phase and variable-phase portions. This makes it easier to maintain the limits at the connecting point 3 to the public network 9.

The harmonic predictor according to the invention can be used so that converters 11 for generators 10 of the wind turbines 1 are controlled in such a way that, with regard to the fixed-phase and variable-phase part, their harmonic components are adjusted so that the total vector T determined by the harmonic predictor 6 does not exceed the harmonic limit LIMIT. As well as adjusting the converter 11, it can also be provided that the number N of wind turbines is reduced in critical cases in order thus to achieve a reduction in the harmonic component. It should be noted that the principle of the harmonic predictor per se can be used for any kind of wind turbines 1; it has proved its worth particularly in wind turbines with doubly-fed asynchronous generator 10. In particular, the problem of the mixed case, that is to say a harmonic component with fixed-phase and variable-phase part, occurs especially with these.

According to the invention, it is not absolutely essential that the harmonic predictor 6 is implemented on a real wind farm. It is also possible to connect the harmonic predictor 6 to a simulation interface 7 (see FIG. 2) which acts together with a simulation computer 70. The simulation interface 7 together with the simulation computer 70 model the electrical behavior of the wind farm with its wind turbines 1 and the internal cable network 2 as far as the connecting point 3. In this way, the behavior of the wind farm with regard to its harmonic component can be determined in advance by means of the harmonic predictor 6 and taken into account when designing the wind farm before it is actually built. This enables the wind farm to be designed with much greater accuracy. For this purpose, the simulation interface 7 has a connection 74 for simulating the signal network with the devices connected thereto and a connection 77 for connecting an output signal 67' of the harmonic predictor 6.

The improvements possible with the harmonic predictor according to the invention are shown in FIG. 3. The aimed-for ideal situation is a reduction in the harmonic component with a reduction factor RF according to a relationship $1/\sqrt{(N)}$, such as can only be achieved with higher order harmonics using conventional means; this is shown in FIG. 3 by means of a dotted line. A reduction as shown by the continuous line can be achieved with the harmonic predictor according to the invention. It can be seen that, although not quite as significant a reduction is achieved as with the higher order harmonics, a considerable improvement is achieved compared with the previous case where no reduction was to be assumed but a constant value of 1 according to the dashed line.

The harmonic loading can therefore be more accurately estimated with the harmonic predictor according to the invention, which ultimately enables more wind turbines to be connected in a wind farm for a given connecting point with specified harmonic limit. It is particularly pleasing that a considerable reduction in the harmonic loading is made possible with the harmonic predictor, even with relatively small wind farms with ten or twenty turbines.

The invention claimed is:

1. A harmonic predictor for a wind farm comprising at least two wind turbines, each having a generator with a converter for generating electrical energy, wherein a limit for the harmonic component generated by the wind farm is determined, the harmonic predictor comprising:
   a calculation module that calculates a complex mean value over at least one period of the harmonic component of one of the wind turbines and determines a first equivalent vector therefrom,
   an iteration module that successively connects the calculation module to at least one other of the wind turbines to form at least one second equivalent vector, and
   a summing module that sums the equivalent vectors to form a total vector and compares the total vector with the harmonic limit,
   wherein the determining of an equivalent vector comprises calculating a mean value of a real part of the harmonic component of the respective wind turbine and calculating a mean value of an imaginary part of the harmonic component of the respective wind turbine.

2. The harmonic predictor of claim 1, wherein the iteration module and the summing module are combined to form a recursion module.

3. A method for limiting the harmonic component generated by a wind farm, wherein the wind farm comprises at least two wind turbines, each having a generator with a converter for generating electrical energy, comprising:
   for a first of the wind turbines, calculating a complex mean value over at least one period of the harmonic component and determining therefrom a first equivalent vector with magnitude and angle,
   for at least one second of the wind turbines, iteratively determining a second equivalent vector in the same manner,
   using the first equivalent vector as the foot of the second equivalent vector for summation, and
   forming a total vector and comparing the total vector with the harmonic limit,
   wherein the determining of an equivalent vector comprises calculating a mean value of a real part of the harmonic component of the respective wind turbine and calculating a mean value of an imaginary part of the harmonic component of the respective wind turbine.

4. The method of claim 3, including recursively determining and summing the equivalent vectors for further wind turbines.

5. The method of claim 3, including splitting the harmonic component into a fixed-phase part and into a variable-phase part.

6. The method of claim 3, wherein the magnitude of the equivalent vector is determined by a mean value of the magnitude of the harmonic component over at least one period.

7. The method of claim 3, wherein the angle of the equivalent vector is determined by the ratio of the mean values of imaginary part to real part.

8. The method of claim 3, including adjusting the ratio between fixed-phase and variable-phase parts of the harmonic component in order to restrict the harmonic component to the limit.

9. The method of claim 3, including limiting the number of wind turbines in order to restrict the harmonic component to the limit.

10. The harmonic predictor of claim 1, wherein the harmonic predictor works together with a limiter to adjust the ratio between fixed-phase and variable-phase parts of the harmonic component in order to restrict the harmonic component to the limit.

11. The harmonic predictor of claim 1, wherein the harmonic predictor works together with a limiter in such a way that the harmonic component is set to the limit by restricting the number of the wind turbines that emit electrical energy.

* * * * *